(12) United States Patent
Hellig et al.

(10) Patent No.: US 6,699,641 B1
(45) Date of Patent: Mar. 2, 2004

(54) PHOTOSENSITIVE BOTTOM ANTI-REFLECTIVE COATING

(75) Inventors: Kay Hellig, Austin, TX (US); Massud Aminpur, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 168 days.

(21) Appl. No.: 10/021,828

(22) Filed: Dec. 12, 2001

(51) Int. Cl.[7] .................................................. G03C 5/00
(52) U.S. Cl. ..................... 430/312; 430/319; 430/270.1
(58) Field of Search ................................ 430/312, 319, 430/270.1

(56) References Cited

U.S. PATENT DOCUMENTS

| | | | |
|---|---|---|---|
| 4,211,834 A | | 7/1980 | Lapadula et al. ........... 430/326 |
| 4,871,630 A | * | 10/1989 | Giammarco et al. .......... 430/14 |
| 4,906,552 A | * | 3/1990 | Ngo et al. .................. 430/312 |

OTHER PUBLICATIONS

Richard D. Coyne et al.; *Resist Processes on Highly Reflective Surfaces Using Antireflection Coatings*– Brewer Science, Inc.; pp. 40–51; 1983.

Ken Harrison et al.; *The Use of Antireflection Coatings for Photoresist Linewidth Control*– National Semiconductor Corporation; pp. 107–111; 1983.

Stanley Wolf and Richard N. Tauber; *Silicon Processing for the VSLI Era, vol. 1—Process Technology*; p. 441; 1986.

Harry J. Levinson; *Principles of Lithography*; pp. 85–88 and 121–124; 2001.

\* cited by examiner

*Primary Examiner*—Rosemary Ashton
(74) *Attorney, Agent, or Firm*—Timothy M. Honeycutt

(57) ABSTRACT

Various circuit structures incorporating masks and anti-reflective coatings and methods of fabricating the same are provided. In one aspect, a circuit structure is provided that includes a substrate and a first photosensitive film on the substrate. The first photosensitive film is photosensitive to a first electromagnetic spectrum and anti-reflective of a second electromagnetic spectrum that differs from the first electromagnetic spectrum. A second photosensitive film is on the first photosensitive film. The second photosensitive film is photosensitive to the second electromagnetic spectrum whereby exposure by the second electromagnetic spectrum will activate the second photosensitive film but not the first photosensitive film and exposure by the first electromagnetic spectrum will activate unmasked portions of the first photosensitive film. The first photosensitive film doubles as an anti-reflective coating that may be patterned anisotropically using lithographic techniques.

25 Claims, 9 Drawing Sheets

PHOTOSENSITIVE BOTTOM ANTI-REFLECTIVE COATING

BACKGROUND OF THE INVENTION

1. Field of the Invention

This invention relates generally to semiconductor processing, and more particularly to a circuit structure incorporating a photosensitive anti-reflective coating and to methods of making the same.

2. Description of the Related Art

The fabrication of modern integrated circuits requires the patterning of millions of different types of regions on a semiconductor wafer, such as local interconnect trenches, global metallization layers, and transistor gates, to name just a few. The manufacture of such multitudes of tiny structures is made possible by the use of lithographic processing. In photolithographic processing, a layer of photoresist material is applied to the wafer, frequently by spin-coating. Next, the photoresist layer is exposed to an actinic radiation source, such as ultraviolet ("UV"). The UV radiation is first passed through a mask or reticle that selectively passes some of the UV radiation while blocking other portions so that only preselected portions of the photoresist are exposed to the radiation. The radiation changes the chemical character of the photoresist, either rendering it soluble or insoluble in a subsequent solvent step, depending upon whether the resist is negative-tone or positive-tone photoresist. The resist is then developed by exposure to a developer solvent. The areas of the photoresist remaining after the development step mask and protect the substrate regions that they cover.

The quality of the developed image depends on, among other things, the optical properties of the resist and the films underlying the resist. In amorphous and polysilicon patterning, oxide films frequently underlie the deposited poly or amorphous film. Highly reflective films, such as polysilicon, metals and oxides tend to reflect significant quantities of radiation back upward and into the resist. This reflected radiation can produce interference patterns within the resist that impact the quality of the image.

During exposure of the mask resist, reflection from the substrate may result in so-called "footing" in the edges of the patterned resist openings. In order to suppress the effects of reflected light, a bottom anti-reflective coating ("BARC") is commonly formed underneath the photoresist layer. The composition of the BARC is selected to be highly absorbing at the exposure wavelength for the photoresist. In one conventional fabrication process, a silicon nitride or oxynitride film is used as a BARC. A photoresist film is applied to the BARC, exposed and developed to uncover portions of BARC. Prior to, additional fabrication steps, such as ion implantation or etching, the uncovered portions of the BARC must normally be removed. This is frequently done with reactive ion etching ("RIE") in order to achieve anisotropic removal. However, RIE subjects the substrate and any circuit structures formed thereon to kinetic bombardment, which can damage critical structures. Wet etching may be used to etch the BARC with lower risk of substrate damage. However, wet etching proceeds isotropically, resulting in undercut of the overlying resist film. If the undercut is severe enough, the resist can lift off.

Another conventional resist process utilizes a polymer-based BARC material that is not photosensitive but is soluble in the resist developer solution. The polymer-based BARC layer is deposited and pre-baked. A resist film is next applied and patterned. The mask pattern is transferred to the BARC during the development step following exposure. This occurs because the BARC polymer material dissolves in the presence of the resist developer solvent. The dissolution of the polymer-based BARC proceeds isotropically at a removal rate that is dependent on the pre-bake conditions. If the pre-bake is deficient, significant undercut of the BARC can occur during resist development and lead to resist lift-off.

The present invention is directed to overcoming or reducing the effects of one or more of the foregoing disadvantages.

SUMMARY OF THE INVENTION

In accordance with one aspect of the present invention, a circuit structure is provided that includes a substrate and a first photosensitive film on the substrate. The first photosensitive film is photosensitive to a first electromagnetic spectrum and anti-reflective of a second electromagnetic spectrum that differs from the first electromagnetic spectrum. A second photosensitive film is on the first photosensitive film. The second photosensitive film is photosensitive to the second electromagnetic spectrum whereby exposure by the second electromagnetic spectrum will activate the second photosensitive film but not the first photosensitive film and exposure by the first electromagnetic spectrum will activate unmasked portions of the first photosensitive film.

In accordance with another aspect of the present invention, a circuit structure is provided that includes a substrate and a positive photoresist film on the substrate. The positive photoresist film is photosensitive to a first electromagnetic spectrum and anti-reflective of a second electromagnetic spectrum that differs from the first electromagnetic spectrum. A photosensitive film is on the positive photoresist film. The photosensitive film is photosensitive to the second electromagnetic spectrum whereby exposure by the second electromagnetic spectrum will activate the photosensitive film but not the positive photoresist film and exposure by the first electromagnetic spectrum will activate unmasked portions of the positive photoresist film.

In accordance with another aspect of the present invention, a method of manufacturing is provided that includes forming a first photosensitive film on a substrate. The first photosensitive film is photosensitive to a first electromagnetic spectrum but anti-reflective of a second electromagnetic spectrum that differs from the first electromagnetic spectrum. A second photosensitive film is formed on the first photosensitive film. The second photosensitive film is photosensitive to the second electromagnetic spectrum whereby exposure by the second electromagnetic spectrum will activate the second photosensitive film but not the first photosensitive film and exposure by the first electromagnetic spectrum will activate unmasked portions of the first photosensitive film.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
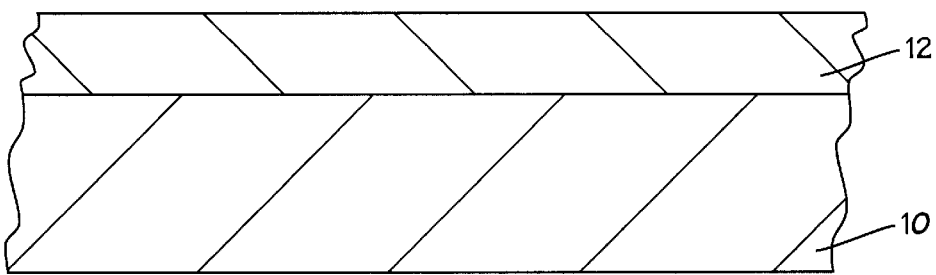
FIG. 1 is a cross-sectional view of a substrate with a conventional silicon nitride-based bottom anti-reflective coating forming thereon.
Figure 2:
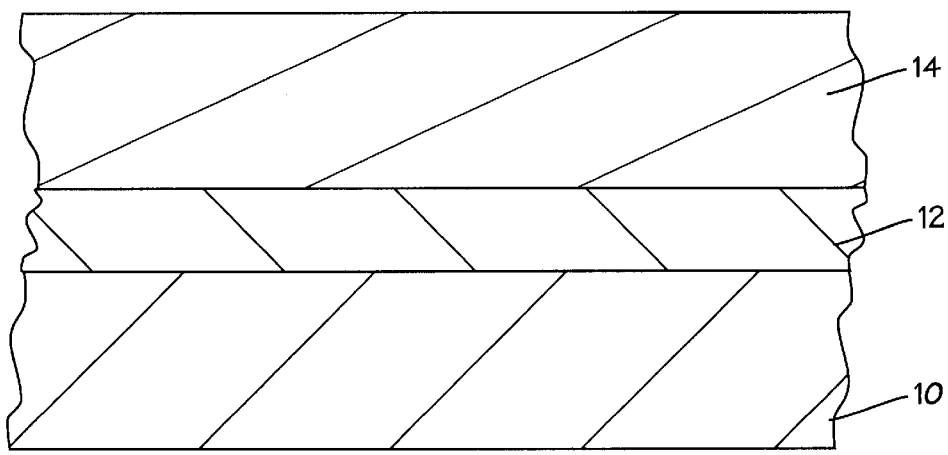
FIG. 2 is a cross-sectional view like FIG. 1 depicting conventional application of a photoresist film on the conventional BARC film.

In the drawings described below, reference numerals are generally repeated where identical elements appear in more than one figure. Turning now to the drawings, FIGS. 1–4 depict successive cross-sectional views illustrating an exemplary conventional method of patterning a photoresist layer on a substrate. Turning initially to FIG. 1, a substrate 10 is coated with a bottom antireflective coating ("BARC") 12. Common conventional BARC materials include, for example, silicon oxynitride, silicon-rich nitride and silicon nitride. Such nitride-based films are usually deposited by blanket CVD processes. Referring now to FIG. 2, the BARC layer 12 layer may be primed with a resist primer, such as hexamethyldisilazane, and a dehydration primer bake is performed. Thereafter, a photoresist film 14 is applied to the BARC 12 by spin-coating and a pre-bake is performed.

Figure 3:
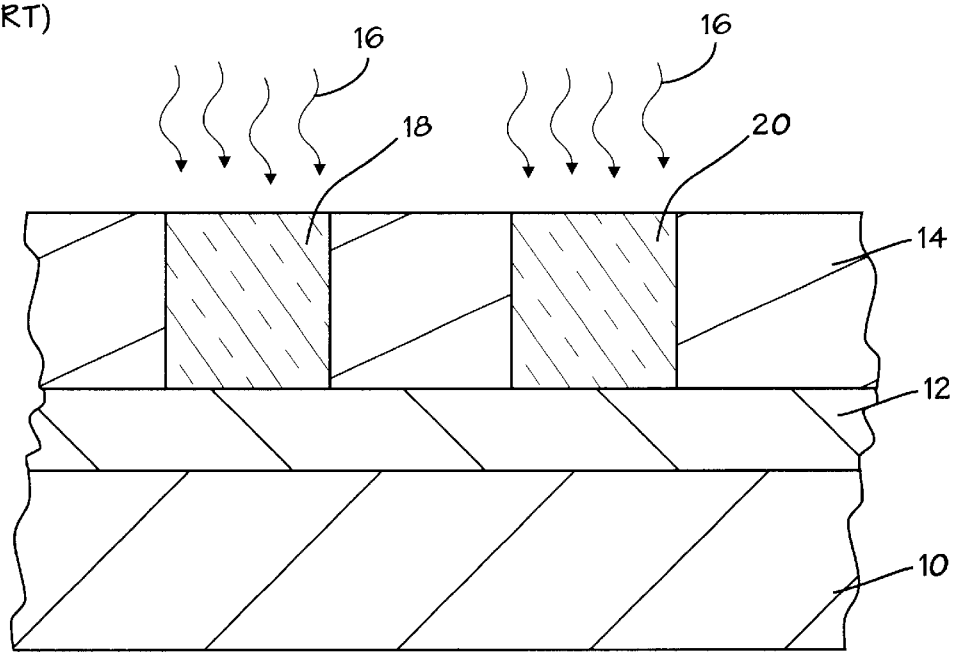
FIG. 3 is a cross-sectional view like FIG. 2 depicting conventional exposure of the photoresist film.

As shown in FIG. 3, selected portions of the photoresist layer 14 are exposed to actinic radiation 16 by means of a reticle (not shown) in order to establish exposed regions 18 and 20. The solubility of the exposed regions 18 and 20 in a developer solution is changed by the exposure to the radiation 16. In the illustrated conventional process flow, the photoresist film 14 is a positive-tone resist. Thus, the exposed regions 18 and 20 become relatively more soluble in a developer solution. The optical properties of the BARC 12 are selected to minimize light reflection at the exposure wavelength in order to reduce the effects from standing waves and reflected light.

Figure 4:
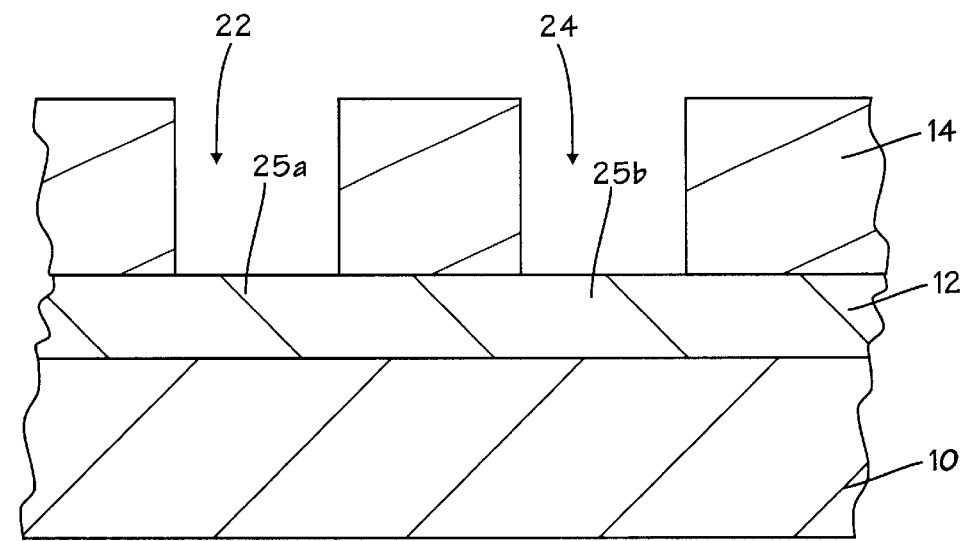
FIG. 4 is a cross-sectional view like FIG. 3 depicting conventional development of the photoresist film.
Figure 5:
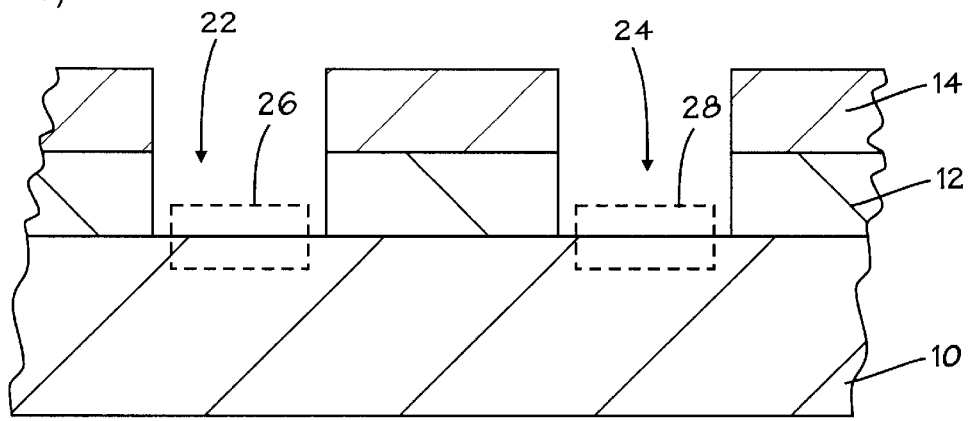
FIG. 5 is a cross-sectional view like FIG. 4 depicting removal of the conventional BARC film.

Following exposure, the photoresist film 14 is exposed to a developer solution to dissolve the exposed regions 18 and 20 depicted in FIG. 3, to leave openings 22 and 24 as shown in FIG. 4. Following development, the substrate 10 may undergo further processing, such as ion implantation or etching with the remaining portions of the photoresist 14 layer serving as a mask for such processes. If ion implantation is contemplated, the portions of the BARC 12 uncovered during the development of the photoresist layer 14 may be left in place during the implant or etched away prior to the implant. Obviously, if etching structures beneath the BARC 12 is contemplated, then some of all of the BARC 12 will have to be removed. In this illustration, the openings are extended to the substrate 10 by removing unmasked portions 25a and 25b of the BARC film 12 so that circuit structures, illustrated schematically by the dashed boxes 26 and 28, may undergo further processing. The removal is by way of a directional plasma etch process such as RIE.

Plasma etch processes are commonly used to remove silicon nitride-based BARC films. The difficulty as noted above, is the propensity for such etch processes to attack and/or damage underlying circuit structures, such as, the structures 26 and 28. Further difficulty is associated with ion implantation in which the BARC 12 is left in place. Implanted ions will have to penetrate through the BARC film 12, necessitating greater energies than would ordinarily be required and attendant risk of greater crystalline damage.

Figure 6:
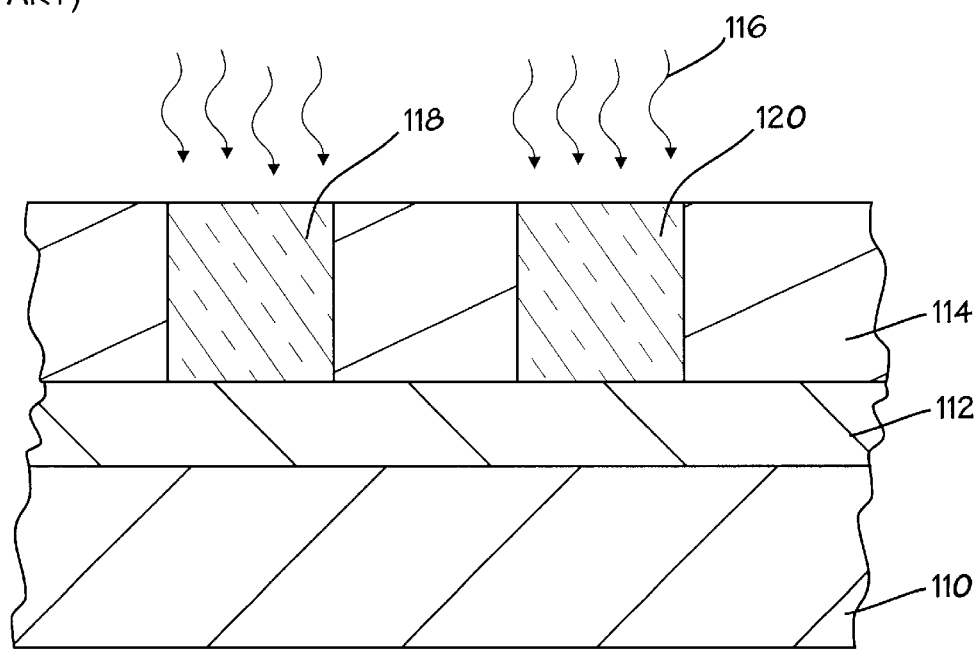
FIG. 6 is a cross-sectional view of a substrate upon which a polymer-based BARC and photoresist layer are formed and exposed in another conventional process.
Figure 7:
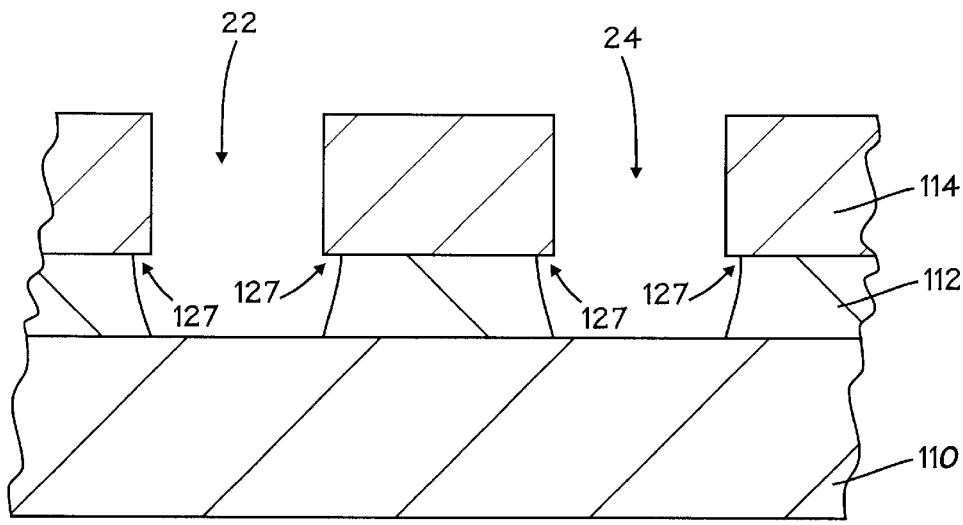
FIG. 7 is a cross-sectional view like FIG. 6 depicting the development of the conventional photoresist film and an underlying polymer-based BARC layer.

Another conventional method of patterning a photoresist film may be understood by referring now to FIGS. 6 and 7. In this conventional process, a substrate 110 is coated with a BARC 112 composed of a polymer film that is absorbing and non-bleaching at the exposure wavelength for an overlying resist film 114. The polymer BARC film 112 is applied by spin-coating and pre-baking. Thereafter, the resist film 114 is applied by spin-coating resist and baking. Selected portions of the photoresist layer 114 are then exposed to actinic radiation 116 by means of a reticle (not shown) in order to establish exposed regions 118 and 120. The solubility of the exposed regions 118 and 120 in a developer solution is changed by the exposure to the radiation 116. In the illustrated conventional process flow, the photoresist film 114 is a positive-tone resist. Thus, the exposed regions 118 and 120 become relatively more soluble in a developer solution. The BARC film 112 is selected to be absorbing of but not photosensitive to the actinic radiation 116.

The development of the resist film 114 is depicted in FIG. 7. During exposure to a developer solvent, the exposed regions 118 and 120 depicted n FIG. 6 dissolve and the pattern of the resist film 114 is transferred to the BARC film 112 via isotropic dissolution of the BARC film 112. Since the removal of the portions of the BARC film 112 corresponding to the openings 122 and 124 in the resist film is isotropic, there will be necessarily some undercut at regions 127 beneath the remaining portions of the resist film 114. If the undercuts at 127 are substantial enough, resist lift-off may occur. One potential cause of large undercut is improper BARC film 112 pre-bake following spin-coating.

Figure 8:
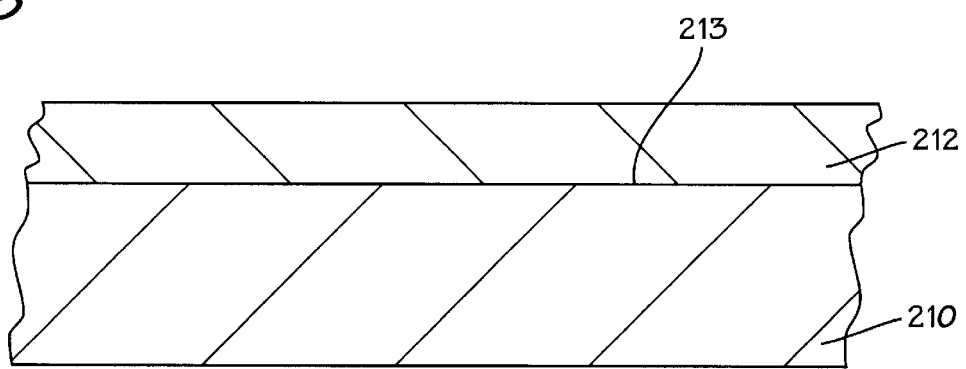
FIG. 8 is a cross-sectional view of an exemplary substrate coated with an exemplary first photosensitive film in accordance with the present invention.

An exemplary process flow for patterning a resist film in accordance with the present 30 invention may be understood by referring now to FIGS. 8, 9, 10, 11, 12 and 13 and initially to FIG. 8. A substrate 210 is initially coated with a photosensitive film 212 that defines an interface 213 between the two films 210 and 212. The substrate 210 may be composed of n-doped silicon, p-doped silicon, silicon-on-insulator or other suitable substrate materials. Optionally, the substrate 210 may be another type of film upon which a photomask is need, such as, for example, an interlevel dielectric layer, or some other type of film used in semiconductor processing. The photosensitive film 212 will function as a BARC for subsequent mask exposure. However, unlike conventional BARC films, the photosensitive film 212 provides for the use of low impact anisotropic removal techniques for improved processing. The photosensitive film 212 is advantageously composed of a photosensitive material that is sensitive to actinic electromagnetic radiation within an electromagnetic spectrum. The term "electromagnetic spectrum" used herein is intended to mean a single wavelength or range of wavelengths as desired. In an exemplary embodiment, the photosensitive film 212 is composed of a positive-tone photoresist material that consists of a matrix, a sensitizer consisting of one or more photosensitive compounds, and a solvent.

Prior to application of the photosensitive film 212, the surface of the substrate 210 may be primed to facilitate photoresist adhesion, particularly if the substrate 210 is composed of oxide. Priming may be combined with the dehydration bake. During the heating cycle, the substrate 210 may be primed with a vapor, such as hexamethyldisilazane, DEATS, a combination of the two or other well-known photoresist primers. As an alternative to vapor priming, the primer may be applied by spin-coating. Following spin-coating, a bake process is performed that is tailored to the material selected for the photosensitive film 212.

Figure 9:
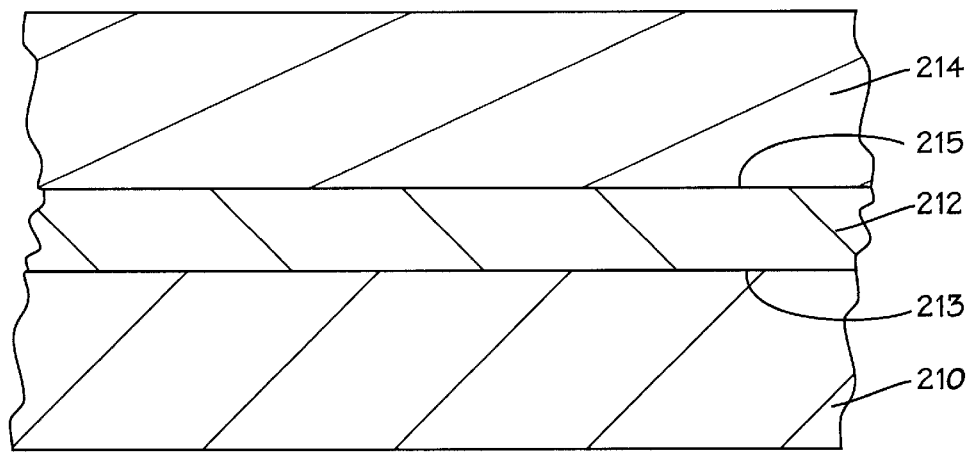
FIG. 9 is a cross-sectional view like FIG. 8 depicting application of a second photosensitive film to the first photosensitive film in accordance with the present invention.

Referring now to FIG. 9, a second photosensitive film 214 is formed on the first photosensitive film 212 that defines an interface 215 between the two films 214 and 212. The photosensitive film 214 will function as a photomask for subsequent processing of not only the substrate 210 but also for pattern transfer to the underlying photosensitive film 212. In this regard, the photosensitive film 214 is advantageously composed of a photosensitive material that is: (1) sensitive to actinic electromagnetic radiation within an electromagnetic spectrum that differs from the electromagnetic spectrum used to expose the film 212; and (2) is absorbing at the electromagnetic spectrum used to expose the film 212. In this way: (1) exposure of the film 214 will not produce a photo activation of the photosensitive film 212: and (2) subsequent exposure of uncovered portions of the film 212 for pattern transfer thereto will not penetrate remaining portions of the film 214. The photosensitive film 214 may be positive-tone or negative-tone as desired. In the illustrated embodiment, the photosensitive film 214 is composed of a positive-tone photoresist material that consists of a matrix, a sensitizer consisting of one or more photosensitive compounds, and a solvent. Application may be by spin-coating or other well-known techniques. The selected thickness and spin-coat rpm will depend on the type of resist, the size of the substrate 210 and the application tool.

Prior to application of the photosensitive film 214, the photosensitive film 212 may be primed using the techniques described above. If desired, a solvent pre-wet process may be performed just prior to application of the resist film 214 in order to overcome the surface energy of the primed surface of the film 212. A variety of well-known solvent pre-wet solvents may be used. For example, a mixture of ethyl-lactate and 4-methyl-2-pentanone may be dispensed on the primed film 212 and spun off. As the pre-wet solvents are evaporating from the film 212, the resist film 214 is applied using the aforementioned techniques.

Figure 10:
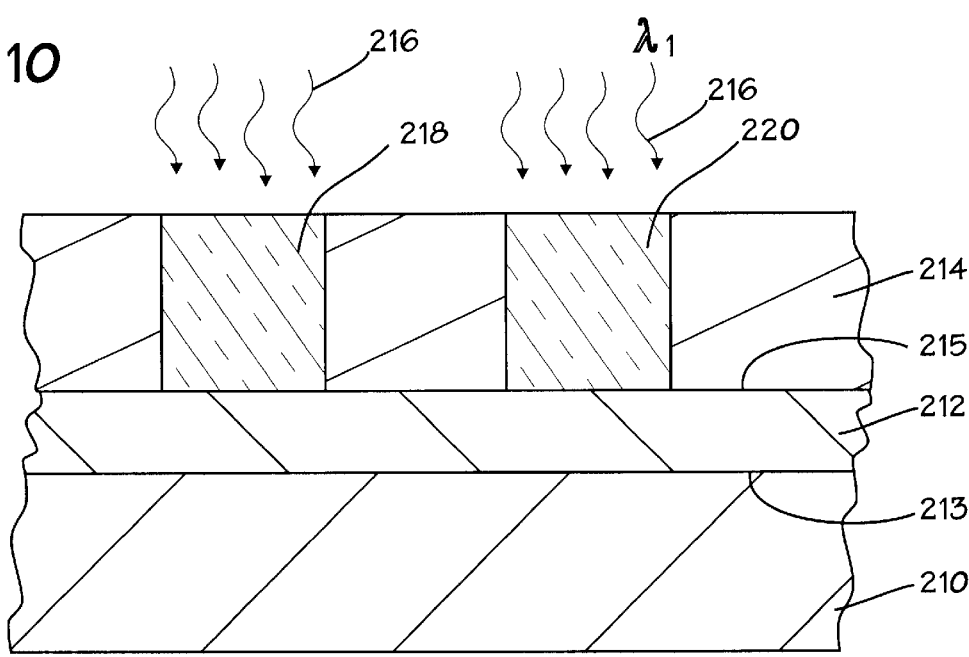
FIG. 10 is a cross-sectional view like FIG. 9 depicting exposure of the first photosensitive film with a first electromagnetic spectrum in accordance with the present invention.

Referring now to FIG. 10, the circuit structure consisting of the substrate 210 and the photosensitive films 212 and 214 is further processed. In the following discussion of and equations that describe the selection of the anti-reflective coating properties of the film 212, the photosensitive film 214 is temporarily designated number "1," the photosensitive film 212 is designated number "2" and the substrate 210 is designated number 3. For example, where a variable is associated with the top film 214, a subscript "1" will be used with that variable, e.g., $n_1$, and where a variable is associated with the film 212, a subscript "2" will be used, e.g., $n_2$, and so forth. Selected portions of the photosensitive film 214 are exposed to actinic radiation 216 with an electromagnetic spectrum $\lambda_1$ by means of a reticle (not shown) to produce exposed regions 218 and 220. During the exposure, the photosensitive film 212 functions as a BARC. The BARC functionality is provided by ensuring that the photosensitive film 212 is optimized to provide minimal reflection of incident radiation used to expose the photosensitive film 214.

In order for the photosensitive film 212 to function as an anti-reflective coating, incident radiation should be attenuated by the film 212 to or near zero. This is expressed mathematically by:

$$\rho_{1,2} + \rho_{2,3} \cdot \exp^{(-i 4\pi n_2 d_2/\lambda_1)} \approx 0 \qquad \text{Equation 1}$$

The quantity $\rho_{1,2}$ is the reflectance at the interface 215 between the film 214 and the film 212, $\rho_{2,3}$ is the reflectance at the interface 213 between the film 212 and the substrate 210, $n_2$ is the real component of the index of refraction of the film 212, $d_2$ is the thickness of the film 212 and $\lambda_1$ is the exposure wavelength or spectrum used to expose the photosensitive film 214.

The values of $\rho_{1,2}$ and $\rho_{2,3}$ are given by:

$$\rho_{1,2} = \frac{\hat{n}_1 - \hat{n}_2}{\hat{n}_1 + \hat{n}_2} \qquad \text{Equation 2}$$

and $$\rho_{2,3} = \frac{\hat{n}_2 - \hat{n}_3}{\hat{n}_2 + \hat{n}_3} \qquad \text{Equation 3}$$

where $\hat{n}_x$ is the complex index of refraction of a given film and is given by:

$$\hat{n}_x = n_x - ik \qquad \text{Equation 4}$$

Here, $n_x$ is the real part and $K_x$ is the imaginary part of the complex index of refraction $\hat{n}_x$.

A truly zero attenuation may be difficult to achieve. However, a useful rule of thumb for minimizing standing waves in the film 214 is to select the properties of the film 212 so that the incident radiation is attenuated to 10% or less in two passes through the film 212. This may be achieved by manipulating the thickness $d_2$, the exposure wavelength or spectrum $\lambda_1$, and the imaginary part $K_2$ of the index of refraction $\hat{n}_2$ of the film 212. The exposure spectrum $\lambda_1$ will be selected to achieve photoactivation of the film 214 but not photoactivation of the film 212. The index of refraction $\hat{n}_3$ of the substrate 210 will be known. The imaginary part $K_1$ of the index of refraction $\hat{n}_1$ of the photosensitive film 214 is selected to be zero at $\lambda_1$ so that the film 214 is non-absorbing at $\lambda_1$. The values of $n_1$ and $n_2$ are chosen to be closely matched so that the reflectance at the interface 215 between the films 214 and 212 is low.

With the foregoing criteria, Equations 1, 2 and 3 may be solved using well-known numerical approximation techniques for values of $d_2$ and $K_2$ that yield a 10% or less attenuation, that is, the left side of Equation 1 is less than or equal to 0.1. Well-known numerical approximation techniques, preferably with the aid of a computing device may be used to find appropriate values of $d_2$ and $K_2$. An exemplary range of appropriate values of $n_1$ and $n_2$ is about 1.2 to 2.0 at $\lambda_1$=248 nm. The value of $K_2$ may be about 0.25 to 1.2. The skilled artisan will appreciate that these values are exemplary and may change for different exposure spectrums.

Figure 11:
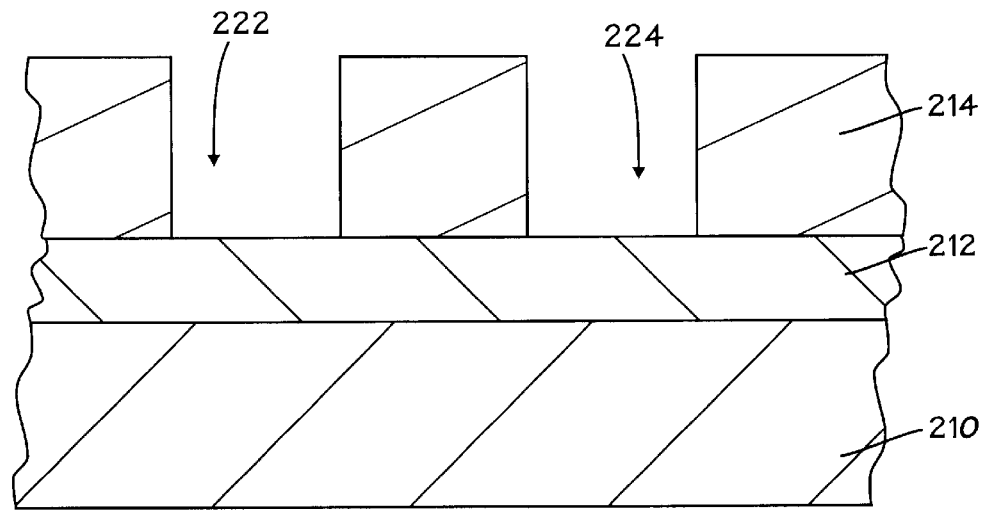
FIG. 11 is a cross-sectional view like FIG. 10 depicting development of the second photosensitive film in accordance with the present invention.

Following exposure, the photosensitive film 214 is developed in a suitable developer solution to dissolve the exposed regions 218 and 220 and leave openings 222 and 224 as shown in FIG. 11. The development process used will depend in large part on design discretion and the particular type of resist material used for the photosensitive film 214. In an exemplary embodiment, an alkaline solution of either KOH or NaOH with a normality of about 0.5 may be used. A multi-stream applicator head may be used with rotation of the substrate 210. The developer solution may be allowed to puddle for about 30 to 60 seconds. Thereafter, a deionized water rinse may be performed on the substrate 210 for about 10 to 30 seconds, again using a multi-stream applicator with rotation of the substrate 210. If negative-tone resist is used for the film 214, a solution of 2.38% (by volume) tetra-methyl-ammonium-hydroxide in water may be used in conjunction with the aforementioned application techniques.

Figure 12:
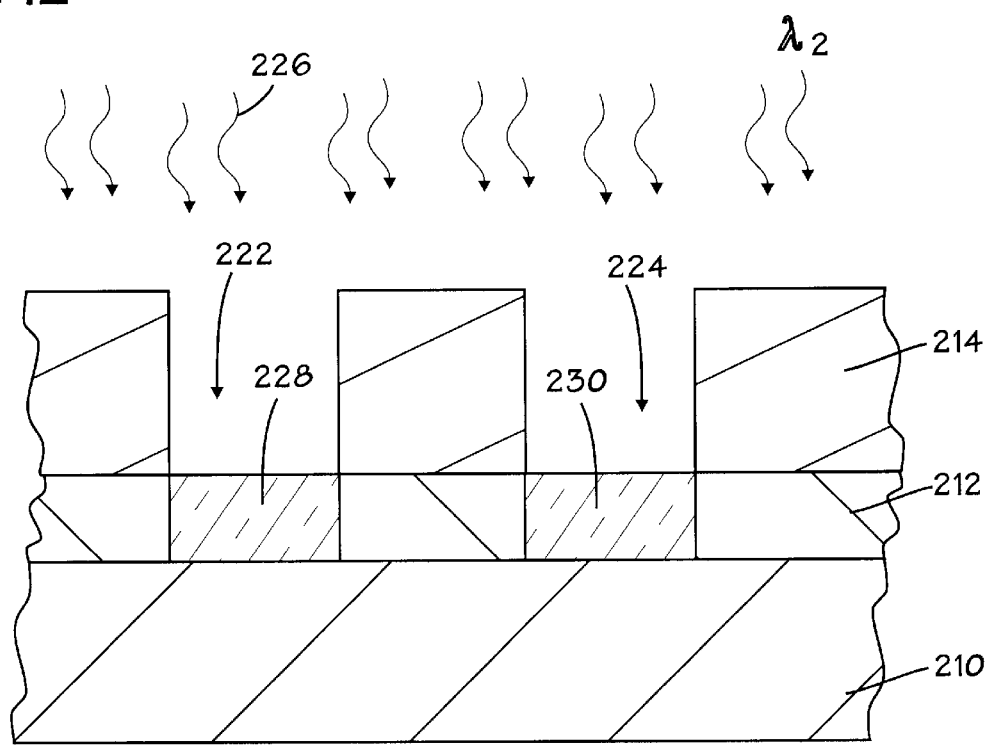
FIG. 12 is a cross-sectional view like FIG. 11 depicting exposure of the underlying first photosensitive film with a second electromagnetic spectrum in accordance with the present invention.

With the openings 222 and 224 formed, selected portions of the photosensitive film 212 may be removed with precision and reduced risk of damaging the underlying substrate 25 210 and any structures thereon. As shown in FIG. 12, portions of the photosensitive film 212 not covered by remaining portions of the photosensitive film 214 are exposed with actinic radiation 226 with electromagnetic spectrum $\lambda_2$ to produce exposed regions 228 and 230. As noted above, the electromagnetic spectrum $\lambda_2$ will differ from the spectrum $\lambda_1$ used to expose the photosensitive film 214. The remaining portions of the photosensitive film 214 act as a mask against the exposure of the photosensitive film 212. Since the remaining portions of the photosensitive film 214 provide an exposure mask, the radiation 226 may be applied without a reticle. However, the photosensitive film 214 should be selected to be absorbing at the spectrum $\lambda_2$ so that the pattern of the film 214 is transferred to the film 212.

Figure 13:
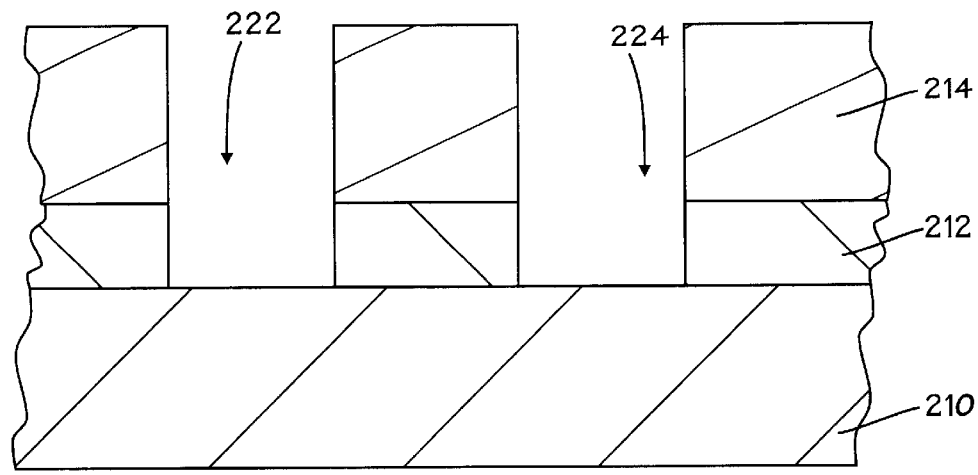
FIG. 13 is a cross-sectional view like FIG. 12 depicting development of the first photosensitive film in accordance with the present invention.

Following exposure, the photosensitive film 212 is developed in a suitable developer solution to dissolve the exposed regions 228 and 230 so that the openings 222 and 224 extend to the substrate 210 as shown in FIG. 13. The development process may be as described elsewhere herein. Significantly, the removal of the exposed regions 228 and 230 need not involve plasma processes or isotropic etching. The underlying substrate 210 and any circuit structures formed thereon are not subjected to stresses associated with kinetic bombardment. Furthermore, the anisotropicity of the removal reduces the risk of undercut and lift-off of the remaining portions of the photosensitive film 214.

The substrate 210 may undergo further processing as desired. For example, the substrate may be subjected to ion implantation or etching with the patterned photosensitive film 214 serving as a mask against such processes. At the conclusion of such additional processing, the photosensitive films 212 and 214 may be removed by well-known resist removal techniques, such as ashing, solvent stripping, combinations of these or the like. Optionally, the films 212 and 214 may be flood-exposed with radiation at electromagnetic spectrums $\lambda_1$ and $\lambda_2$ and removed en-masse using a well-known development step(s) suitable for the compositions of the films 212 and 214.

The selection of the electromagnetic spectrums $\lambda_1$ and $\lambda_2$ depends largely on the requirements of the photosensitive film 214. For example, if resolution requirements call for deep UV exposure of the photosensitive film 214, then $\lambda_1$ may be, for example, about 248 nm and $\lambda_2$ may be selected to differ from $\lambda_1$. For example, $\lambda_2$ may be about 300 to 500 nm or about 100 to 200 nm. If I-line exposure is desired for the photosensitive film 214, then $\lambda_1$ may be about 365 nm and $\lambda_2$ may be about 100 to 300 nm or 400 to 600 nm. The appropriate value of $\lambda_1$ will also depend on the photosensitivity of the photosensitive film 212. These examples represent just two possible alternatives. The skilled artisan will appreciate that the technique may be applied at virtually any wavelength(s) used in lithographic processing.

Figure 14:
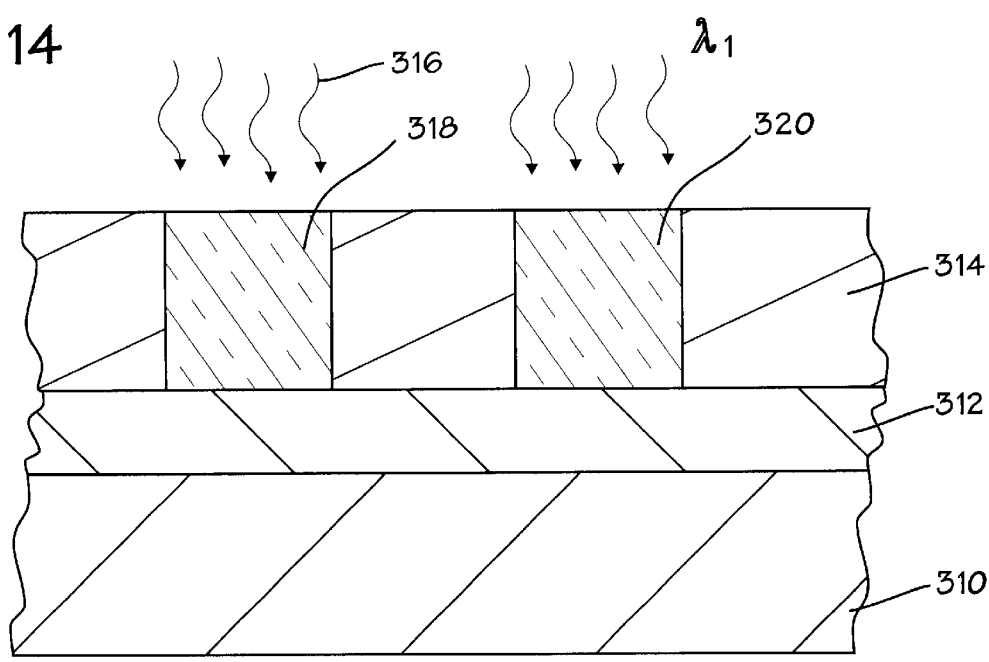
FIG. 14 depicts an alternate exemplary embodiment of a first photosensitive film and an overlying negative-tone photosensitive film undergoing selective exposure at a first electromagnetic spectrum in accordance with the present invention.
Figure 15:
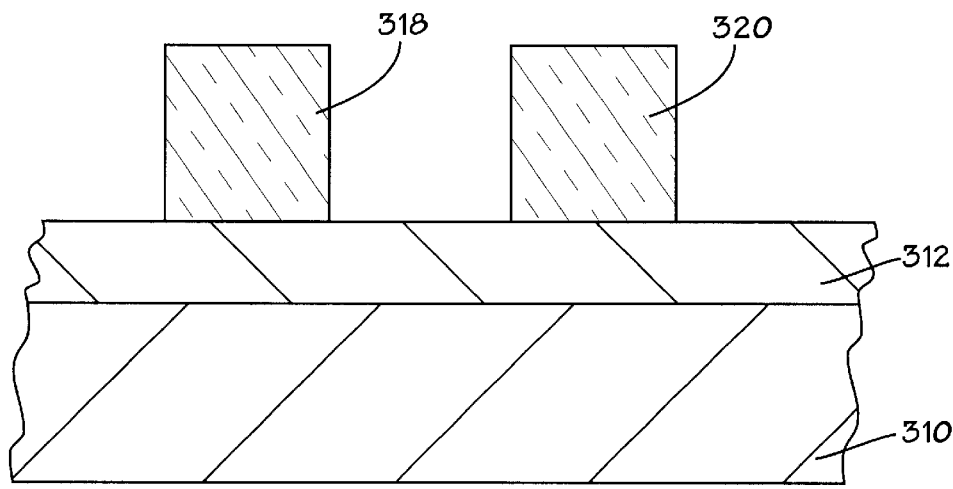
FIG. 15 is a cross-sectional view like FIG. 14 depicting development of the exposed negative-tone photosensitive film in accordance with the present invention.
Figure 16:
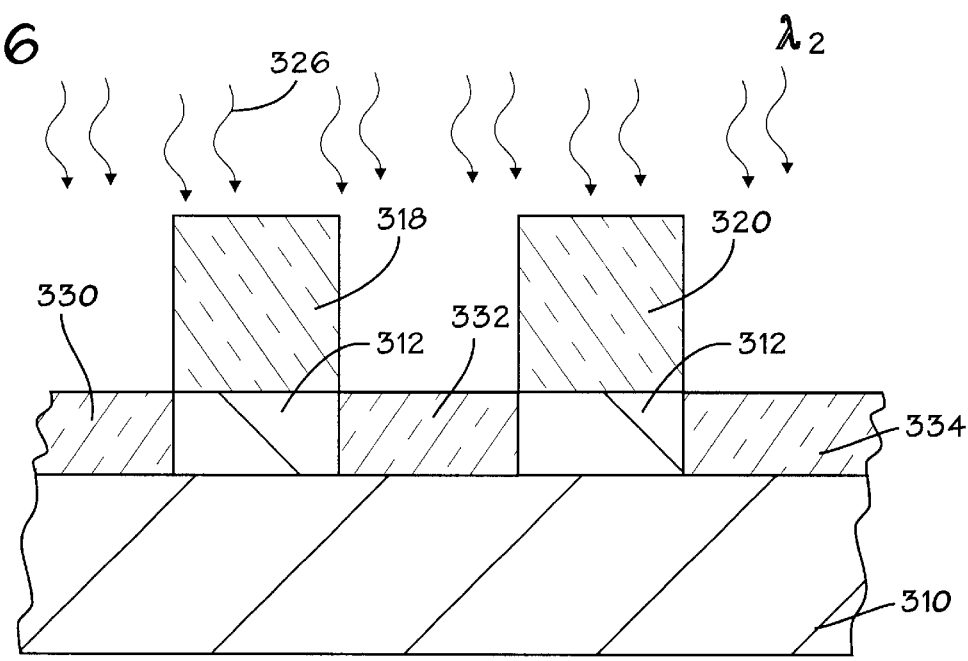
FIG. 16 is a cross-sectional view like FIG. 15 depicting exposure of the first photosensitive film at a second electromagnetic spectrum in accordance with the present invention.

An alternate exemplary process flow in accordance with the present invention that incorporates the use of a negative-tone photoresist layer may be understood by referring now to FIGS. 14, 15, 16 and 17. Turning initially to FIG. 14, a substrate 310 is coated with a photosensitive film 312 that doubles as a BARC as described elsewhere herein. Thereafter, a negative-tone photoresist film 314 is applied to the photosensitive film 312 using well-known techniques for application of negative-tone photoresist. The photoresist film 314 is then selectively exposed to actinic radiation 316 via a suitable mask or reticle (not shown) at an exposure wavelength $\lambda_1$ of the type described elsewhere herein to produce exposed regions 318 and 320. The exposed regions 318 and 320 will undergo solubility changes as a result of the exposure and thus become relatively less soluble in a negative-tone developer solvent. Referring now also to FIG. 15, the negative-tone resist film 314 is developed, leaving the exposed regions 318 and 320 on the photosensitive film 312 as shown. Referring now to FIG. 16, the photosensitive film 312 is exposed to actinic radiation 326 at an electromagnetic spectrum $\lambda_2$ of the type described elsewhere herein. The exposed regions 318 and 320 remaining after the initial developer step act as (mask) against the exposure of the film 312.

Figure 17:
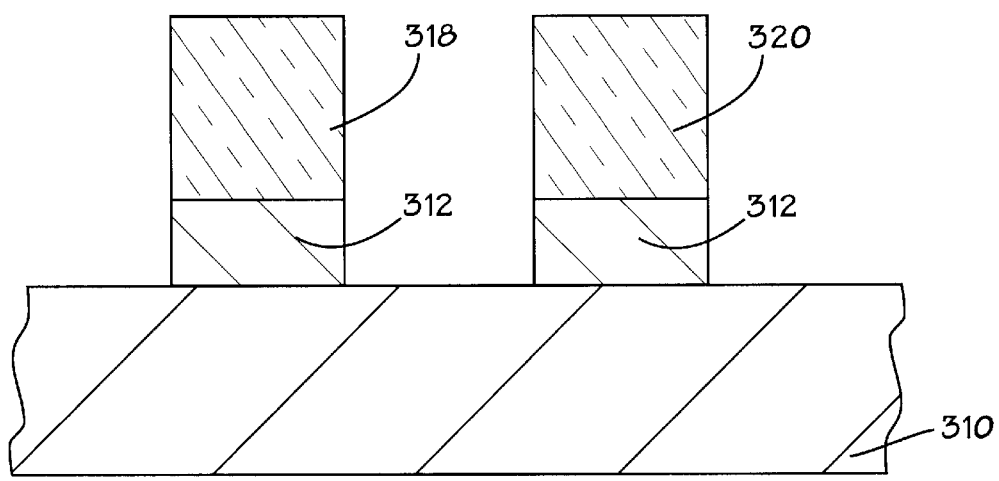
FIG. 17 is a cross-sectional view like FIG. 16 depicting development of the first photosensitive film in accordance with the present invention.

Referring now also to FIG. 17, the exposed regions 330, 332 and 334 are removed in a photoresist development process of the type described elsewhere herein, leaving mask stacks consisting of the remaining portions of the photosensitive film 312 and the overlying exposed regions 318 and 320 of the originally applied photosensitive film 314 (see FIG. 14). At this point, the substrate 310 may undergo subsequent processing as desired and as described elsewhere.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A circuit structure, comprising:
   a substrate;
   a first photosensitive film on the substrate, the first photosensitive film being photosensitive to a first electromagnetic spectrum of about 300 to 500 nm and anti-reflective of a second electromagnetic spectrum of about 100 to 365 nm ; and
   a second photosensitive film on the first photosensitive film, the second photosensitive film being photosensitive to the second electromagnetic spectrum and absorbing of the first electromagnetic spectrum whereby exposure by the second electromagnetic spectrum will activate the second photosensitive film but not the first photosensitive film and exposure by the first electromagnetic spectrum will activate unmasked portions of the first photosensitive film.

2. The circuit structure of claim 1, wherein the first photosensitive film is absorbing at the second electromagnetic spectrum.

3. The circuit structure of claim 1, wherein the second photosensitive film is patterned with an opening enabling exposure of the first photosensitive film with the first electromagnetic spectrum.

4. The circuit structure of claim 1, wherein the substrate comprises an insulator.

5. The circuit structure of claim 4, wherein the insulator comprises oxide.

6. The circuit structure of claim 1, wherein the substrate comprises a semiconductor.

7. A circuit structure, comprising:
   a substrate;
   a positive photoresist film on the substrate, the positive photoresist film being photosensitive to a first electromagnetic spectrum and anti-reflective of a second electromagnetic spectrum; and
   a photosensitive film of negative photoresist on the positive photoresist film, the photosensitive film being photosensitive to the second electromagnetic spectrum that differs from the first electromagnetic spectrum whereby exposure by the second electromagnetic spectrum will activate the photosensitive film but not the positive photoresist film and exposure by the first electromagnetic spectrum will activate unmasked portions of the positive photoresist film.

8. The circuit structure of claim 7, wherein the photosensitive film comprises positive photoresist.

9. The circuit structure of claim 7, wherein the first photosensitive film is absorbing at the second electromagnetic spectrum.

10. The circuit structure of claim 7, wherein the second photosensitive film is patterned with an opening enabling exposure of the first photosensitive film with the first electromagnetic spectrum.

11. The circuit structure of claim 7, wherein the first electromagnetic spectrum comprises about 300 to 500 nm and the second electromagnetic spectrum comprises about 100 to 365 nm.

12. The circuit structure of claim 7, wherein the first electromagnetic spectrum comprises about 100 to 200 nm and the second electromagnetic spectrum comprises about 100 to 248 nm.

13. The circuit structure of claim 7, wherein the substrate comprises an insulator.

14. The circuit structure of claim 13, wherein the insulator comprises oxide.

15. The circuit structure of claim 7, wherein the substrate comprises a semiconductor.

16. A method of manufacturing, comprising:
    forming a first photosensitive film on a substrate, the first photosensitive film being photosensitive to a first electromagnetic spectrum and anti-reflective of a second electromagnetic spectrum that differs from the first electromagnetic spectrum; and
    forming a second photosensitive film of negative photoresist on the first photosensitive film, the second photosensitive film being photosensitive to the second electromagnetic spectrum whereby exposure by the second electromagnetic spectrum will activate the second photosensitive film but not the first photosensitive film and exposure by the first electromagnetic spectrum will activate unmasked portions of the first photosensitive film.

17. The method of claim 16, comprising exposing the second photosensitive film with the second electromagnetic spectrum to produce a first exposed region of the second photosensitive film.

18. The method of claim 16, comprising developing the second photosensitive film to define a first opening therein extending to the first photosensitive film.

19. The method of claim 18, comprising exposing the first photosensitive film to the first electromagnetic spectrum to produce a second exposed region of the first photosensitive film.

20. The method of claim 19, comprising developing the first photosensitive film to define a second opening therein extending to the substrate.

21. The method of claim 20, comprising subjecting the substrate to a process step with the first and second photosensitive films masking selected portions thereof.

22. The method of claim 16, wherein the first photosensitive film comprises positive photoresist.

23. A circuit structure, comprising:
    a substrate;
    a first photosensitive film on the substrate, the first photosensitive film being photosensitive to a first electromagnetic spectrum of about 100 to 200 nm and anti-reflective of a second electromagnetic spectrum of about 100 to 248 nm; and
    a second photosensitive film on the first photosensitive film, the second photosensitive film being photosensitive to the second electromagnetic spectrum and absorbing of the first electromagnetic spectrum whereby exposure by the second electromagnetic spectrum will activate the second photosensitive film but not the first photosensitive film and exposure by the first electromagnetic spectrum will activate unmasked portions of the first photosensitive film.

24. The circuit structure of claim 23, wherein the first photosensitive film is absorbing at the second electromagnetic spectrum.

25. The circuit structure of claim 23, wherein the second photosensitive film is patterned with an opening enabling exposure of the first photosensitive film with the first electromagnetic spectrum.

* * * * *